(12) United States Patent
Hong et al.

(10) Patent No.: US 11,960,804 B2
(45) Date of Patent: Apr. 16, 2024

(54) PERIDYNAMIC METHOD HAVING ADDITIONAL MIRRORING NODE, AND NUMERICAL ANALYSIS APPARATUS USING SAME

(71) Applicant: Korea Advanced Institute of Science And Technology, Daejeon (KR)

(72) Inventors: Jung-Wuk Hong, Daejeon (KR); Seong Eun Oh, Daejeon (KR); Sang Eon Lee, Daejeon (KR); Suyeong Jin, Daejeon (KR)

(73) Assignee: Korea Advanced Institute of Science And Technology (KR)

( * ) Notice: Subject to any disclaimer, the term of this patent is extended or adjusted under 35 U.S.C. 154(b) by 921 days.

(21) Appl. No.: 16/959,942

(22) PCT Filed: Jan. 19, 2018

(86) PCT No.: PCT/KR2018/000877
§ 371 (c)(1),
(2) Date: Jul. 2, 2020

(87) PCT Pub. No.: WO2019/135439
PCT Pub. Date: Jul. 11, 2019

(65) Prior Publication Data
US 2021/0073444 A1    Mar. 11, 2021

(30) Foreign Application Priority Data

Jan. 5, 2018    (KR) .......................... 10-2018-0001498

(51) Int. Cl.
*G06F 30/23*     (2020.01)
*G06F 9/38*      (2018.01)
*G06F 17/16*     (2006.01)

(52) U.S. Cl.
CPC .............. *G06F 30/23* (2020.01); *G06F 17/16* (2013.01); *G06F 9/3836* (2013.01)

(58) Field of Classification Search
CPC ........ G06F 30/23; G06F 17/16; G06F 9/3836; G06F 30/20
See application file for complete search history.

(56) References Cited

FOREIGN PATENT DOCUMENTS

CN         105930619 A  *  9/2016  ......... G06F 17/5036

OTHER PUBLICATIONS

M.H. Hafezi, et al., "Crack propagation modeling using Peridynamic theory," Proc. SPIE 9805, Health Monitoring of Structural and Biological Systems 2016, 98050P (Apr. 1, 2016) (Year: 2016).*

(Continued)

*Primary Examiner* — Steven W Crabb
(74) *Attorney, Agent, or Firm* — FOLEY & LARDNER LLP

(57) ABSTRACT

A peridynamic method having an added mirroring node according to embodiments of the present invention includes: a first step of calculating a shape tensor of a first node; a second step of calculating force state vectors of the first node and each of a plurality of second nodes by using the shape tensor; and a third step of calculating a peridynamic motion equation of the first node by using the force state vectors. The first node is a node located on a boundary of a structure and has a predetermined size horizon region, the plurality of second nodes is nodes in the horizon region, the plurality of second nodes includes one or more third nodes, and the third node is a second node having no node at a point which is origin-symmetrical based on the first node among the plurality of second nodes. In the first step, the shape tensor is calculated by using a position value in which the third node is origin-symmetrical based on the first node.

10 Claims, 3 Drawing Sheets

(56) References Cited

OTHER PUBLICATIONS

Littlewood et al., Peridynamic Simulation of Damage Evolution for Structural Health Monitoring, Proceedings of the ASME 2012 International Mechanical Engineering Congress & Exposition (Year: 2012).*

International Search Report dated Nov. 9, 2018 in PCT/KR2018/000877 with English-language translation (6 pgs.).

Seong Eun Oh et al., "Boundary Effect Analysis according to the Size of Horizon in State-based Peridynamic," Department of Civil and Environmental Engineering, Korea Advanced Institute of Science and Technology, Korean Society for Computational Mechanics Conference on Computational Mechanics, Feb. 2017, 3 pages.

Seong Eun Oh et al., "Imposition of Compatible Dirichlet Boundaries in State-based Peridynamics," Department of Civil and Environmental Engineering, Korea Advanced Institute of Science and Technology, Apr. 6, 2017, 20 pages.

Seong Eun Oh et al., "Peridynamics: From the bond-based approach to the state-based formulation," Advanced Applied Mechanics Lab, Korea Advanced Institute of Science and Technology, Korean Society for Computational Mechanics Fall Workshop, Sep. 1, 2017, 25 pages.

* cited by examiner

[Figure 1]
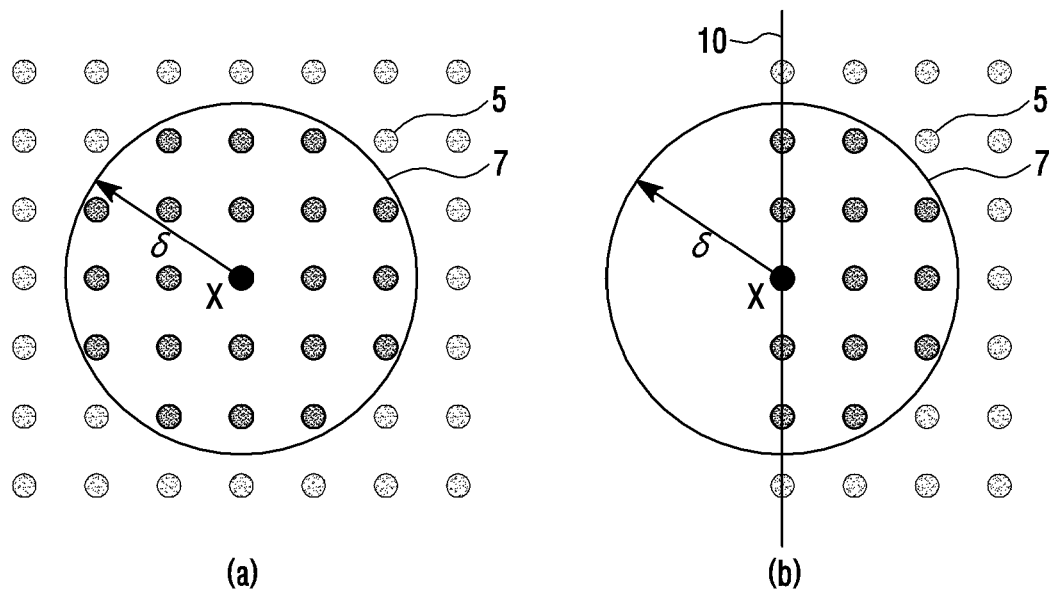
(a)            (b)
[Figure 2]
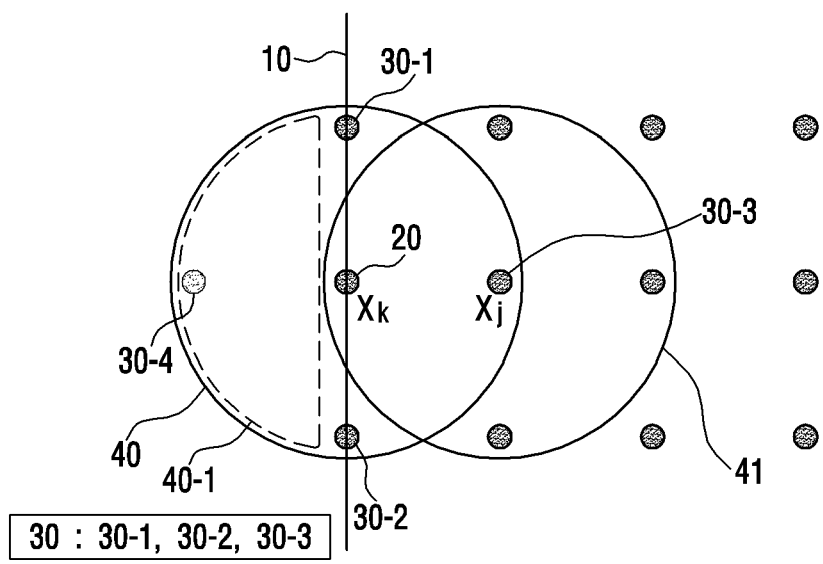
30 : 30-1, 30-2, 30-3

[Figure 3]
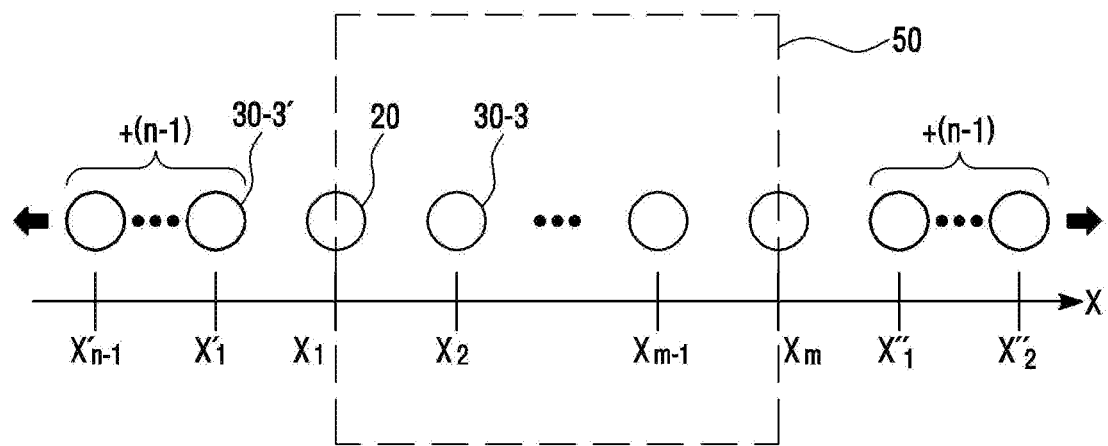
[Figure 4]
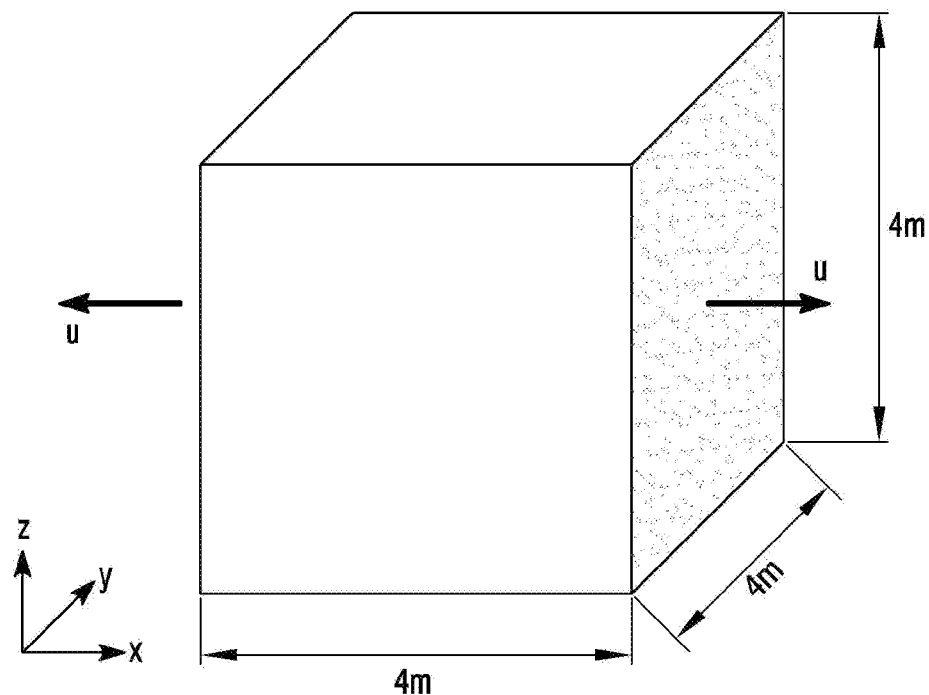

[Figure 5]
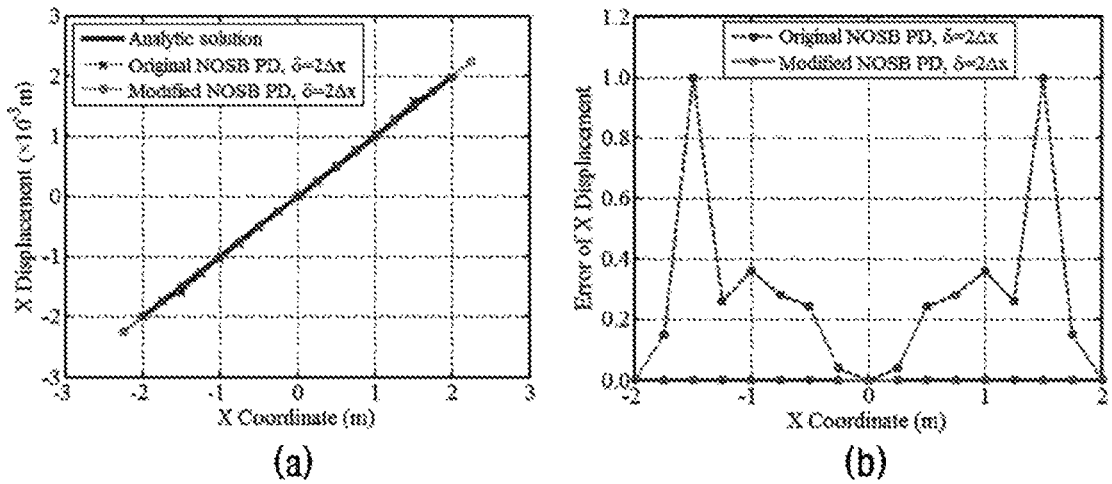
(a)  (b)
[Figure 6]
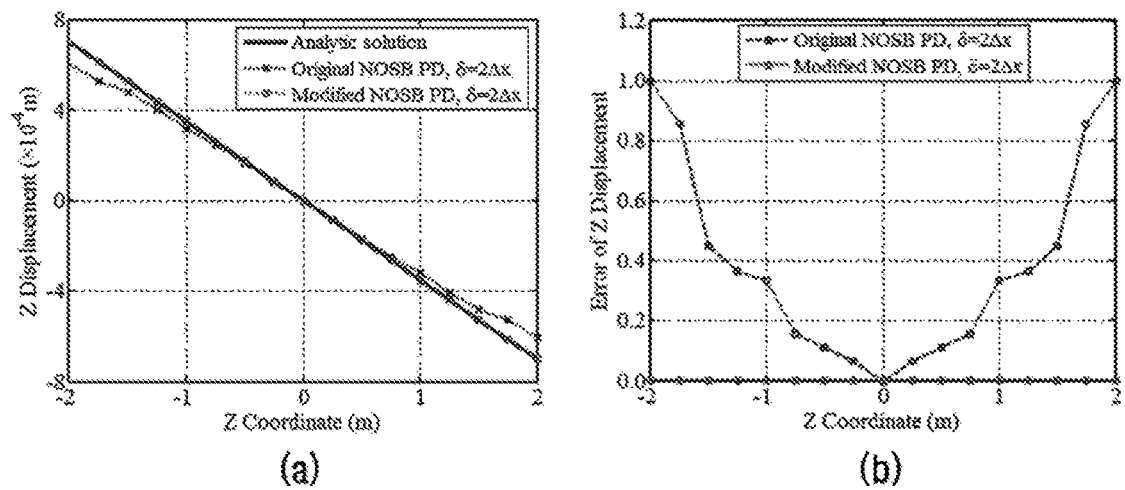
(a)  (b)
[Figure 7]
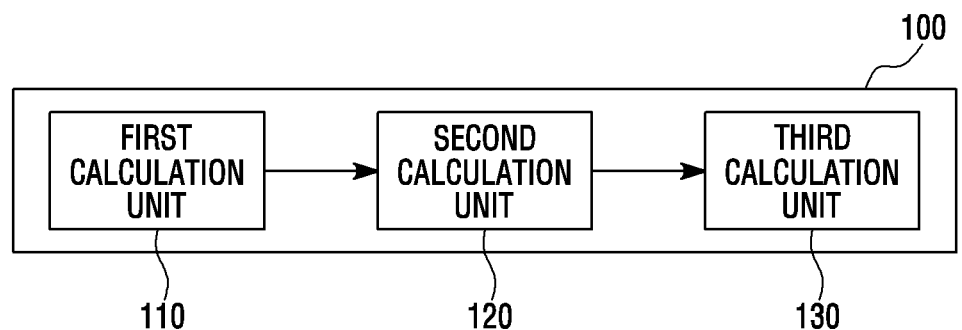

PERIDYNAMIC METHOD HAVING ADDITIONAL MIRRORING NODE, AND NUMERICAL ANALYSIS APPARATUS USING SAME

CROSS REFERENCE TO RELATED APPLICATIONS

This application is a national stage entry of International Application No. PCT/KR2018/000877, filed Jan. 19, 2018; which claims priority to Korean Application No. 10-2018-0001498, filed Jan. 5, 2018; the disclosures of both of which are incorporated by reference herein in their entirety.

TECHNICAL FIELD

The present invention relates to a peridynamic method which is a numerical analysis method for creation and progress phenomena of cracks in a structure, and more particularly, to a peridynamic method having an added mirroring node and a numerical analysis apparatus using the same, which add a mirroring node to improve an inaccurate analysis result on a boundary of the structure.

BACKGROUND ART

Stress concentration due to defects such as gaps or notches in a structure (or material) creates cracks or causes the created cracks to progress. This can weaken a function of the structure. Therefore, in order to analyze creation and progress phenomena of the cracks occurring in the structure, a demand for a numerical analysis method for analyzing the structure has steadily existed and related technologies have also been developed.

As a general numerical analysis method for analyzing the structure, there is a finite element method. In the finite element method, since differentials are used in a calculation process, it is difficult to analyze discontinuous points such as the cracks in the structure. In order to solve the problem, an extended finite element method, a meshless method, an element remeshing method, etc., are developed. However, in the developed numerical analysis methods, since a calculation is made based on the differentials, the calculation at the discontinuous points such as the cracks in the structure is very complicated.

As a numerical analysis method suitable for analyzing the creation and progress phenomena of the cracks which occur in the structure, a peridynamic method using integrals instead of the differentials in a motion equation is developed.

As an invention that analyzes a crack pattern of the structure by using the peridynamic method, there is Korean Patent Registration No. 1618360, "Apparatus and Method for Analyzing Crack Pattern of Material Using State-Based Peridynamic Model". The invention provides an apparatus and a method for analyzing a crack pattern of a material using a state-based peridynamic model, which have no mathematical contradiction of a destruction phenomenon even though a discontinuous phenomenon occurs and can increase reliability by causing a natural analysis result rather than an artificial condition.

A calculation principle of the peridynamic method is a method that determines a predetermined horizon having a radius size of δ for one node, and calculates and sums interactions with all nodes in the horizon. The peridynamic method is developed to solve a problem of existing numerical analysis methodologies, but does not have a complete region (horizon) on the boundary of the material or structure, and as a result, the peridynamic method still has a problem in that an inaccurate numerical analysis result is obtained around the boundary of the material or structure.

DISCLOSURE

Technical Problem

A technical problem to be solved by the present invention is to provide a peridynamic method having an added mirroring node, which may improve an inaccurate numerical analysis result on a boundary in a structure, which occurs in the existing peridynamic method.

Further, the technical problem is to provide a peridynamic method having an added mirroring node, which may obtain an accurate numerical analysis result and shorten even a numerical analysis time with a smaller number of nodes than that of the existing peridynamic method.

However, it is to be understood that the technical problem to be solved by the present invention is not limited to the above problems and may be variously extended without departing from the concept and scope of the present invention.

Technical Solution

In order to solve the problem, a peridynamic method having an added mirroring node according to embodiments of the present invention includes: a first step of calculating a shape tensor of a first node; a second step of calculating force state vectors of the first node and each of a plurality of second nodes by using the shape tensor; and a third step of calculating a peridynamic motion equation of the first node by using the force state vectors. The first node is a node located on a boundary of a structure and has a predetermined size horizon region and the plurality of second nodes is nodes in the horizon region and the plurality of second nodes includes one or more third nodes. The third node refers to a second node having no node at a point which is origin-symmetrical based on the first node among the plurality of second nodes. In the first step, the shape tensor is calculated by using a position value in which the third node is origin-symmetrical based on the first node.

According to an embodiment, the first node is a node located on a boundary to which a Dirichlet boundary condition is applied, and in the third step, a mirroring node is added by mirroring the plurality of third nodes based on the first node and then the peridynamic motion equation of the first node is calculated.

According to an embodiment, when a size δ in one direction of the horizon region is n×x, the number of added mirroring nodes is n−1. Here, n is a constant and when n−1 is a real number, numbers below a decimal point are discarded. Ax represents a distance between the first node and the third node.

According to an embodiment, in the process of calculating the peridynamic motion equation of the first node, the boundary condition of the added mirroring node is as follows. The displacement value between the added mirroring node and the first node is equal to a value in which a displacement value between the first node and the third node is origin-symmetrical.

According to an embodiment, in the process of calculating the peridynamic motion equation of the first node, the boundary condition of the added mirroring node is as follows. The displacement value between the added mirroring node and the first node adopts a value which is origin symmetrical to a displacement value between the first node and a fourth node, and is determined in proportion to a distance between the added mirroring node and the first node and a distance between the first node and the fourth node in the existing reference configuration. Here, the fourth node is a node which exists outside the horizon region of the first node.

According to an embodiment, an equation of calculating the shape tensor is Equation 1 below.

$$K = \underline{X}^* \underline{X} = \int_H \underline{\omega} <\xi> \underline{X}<\xi> \lfloor \underline{X}<\xi> dV = \int_H \underline{\omega} \lfloor \xi \rfloor \xi dV \quad \text{[Equation 1]}$$

(ξ represents a vector between the first node and the plurality of second nodes, V represents a volume of the second node, and ω represents an influence function)

According to an embodiment, an equation of calculating the force state vector is Equation 2 below.

$$\underline{T} = \omega <\xi> P K^{-1}$$

(ω represents the influence function, ξ represents the vector between the first node and the plurality of second nodes, P represents a first Piola-Kirchhoff stress tensor, and K represents the shape tensor)

According to an embodiment, an equation of calculating the peridynamic motion equation of the first node is Equation 3 below.

$$\rho \ddot{u}(x,t) = \int_{Hx} \{\underline{T}[x,t]<x'-x> - \underline{T}[x',t]<x-x'>\} dV_{x'} + b(x,t) \quad \text{[Equation 3]}$$

(ρ represents a density, ü(x,t) represents an acceleration of the first node, T[x,t] represents the force state vector of the first node, T[x',t] represents the force state vector of the second node, and b(x,t) represents a body force of the first node)

Provided is a computer readable recording medium having a program for executing a peridynamic method according to the embodiments, which is recorded therein.

In order to solve the problem, a numerical analysis apparatus according to an embodiment of the present invention includes a first calculation unit, a second calculation unit, and a third calculation unit. The first calculation unit calculates a shape tensor K of a first node and the second calculation unit calculates force state vectors T of the first node and each of a plurality of second nodes by using the shape tensor. The third calculation unit calculates a peridynamic motion equation of the first node by using the force state vectors. Here, the first node is a node located on a boundary of a structure and has a predetermined size horizon region. The plurality of second nodes is nodes in the horizon region and includes one or more third nodes. The third node refers to a second node having no node at a point which is origin-symmetrical based on the first node among the plurality of second nodes. The first calculation unit calculates the shape tensor by using a position value in which the third node is origin-symmetrical based on the first node. Further, when the first node is a node located on a boundary to which a Dirichlet boundary condition is applied, the third calculation unit adds a mirroring node by mirroring the plurality of third nodes based on the first node and then calculates the peridynamic motion equation of the first node.

Advantageous Effects

A peridynamic method having an added mirroring node according to an embodiment of the present invention can improve an inaccurate numerical analysis result on a boundary in a structure, which occurs in the existing peridynamic method.

Further, an accurate numerical analysis result can be obtained and even a numerical analysis time can be shortened with a smaller number of nodes than the existing peridynamic method.

However, the effects of the present invention are not limited to the above effects and may be variously extended without departing from the technical concept and scope of the present invention.

DESCRIPTION OF DRAWINGS

FIG. 1 is a diagram for describing a calculation principle of the existing peridynamic method.

FIG. 2 is a diagram for describing a method for obtaining a shape tensor in Equation 3.

FIG. 3 is a diagram for describing an added mirroring node when a node is located at a boundary to which a Dirichlet boundary condition is applied.

FIG. 4 is a diagram illustrating a numerical analysis model for applying embodiments of the present invention.

FIG. 5 is a diagram illustrating an x-axis direction displacement along an x axis of a numerical analysis model and an error thereof.

FIG. 6 is a diagram illustrating a z-axis direction displacement along a z axis of a numerical analysis model and an error thereof.

FIG. 7 is a diagram illustrating a numerical analysis apparatus using a peridynamic method according to an embodiment of the present invention.

MODE FOR INVENTION

Hereinafter, embodiments of the present invention will be described in detail with reference to the accompanying drawings. A detailed description of a part of the components of the present invention which those skilled in the art can clearly understand and easily reproduce by the prior art will be omitted so as not to obscure the gist of the present invention.

Stress concentration due to defects such as gaps or notches in a structure (or material) creates cracks or causes the created cracks to progress in the structure. Since this weakens a function of the structure, a numerical analysis method for analyzing the structure has been steadily developed in order to analyze creation and progress phenomena of cracks which occur in the structure.

As a numerical analysis method suitable for analyzing the creation and progress phenomena of the cracks which occur in the structure, a peridynamic method using integrals instead of the differentials in a motion equation is developed.

FIG. 1 is a diagram for describing a calculation principle of the existing peridynamic method. A structure to which the peridynamic method is applied has nodes 5. FIG. 1(a) is a diagram illustrating nodes 5 which exist in the structure and a horizon region 7 of one node X and FIG. 1(b) is a diagram illustrating a boundary 10 of the structure and the nodes 5 which exist in the structure, and the horizon region 7 of one node X.

Referring to FIG. 1, the calculation principle of the existing peridynamic method is a method that determines a predetermined region (horizon region) 7 having a radius size of 6 for one node 5, and calculates and sums interactions with all nodes in the region 7.

The existing peridynamic method is developed to solve a problem of the existing numerical analysis methods (e.g., finite element method, extended finite element method, meshless method, element remeshing method, etc.).

However, in the existing peridynamic method, when the interactions of the nodes which exist in the structure are calculated and summed as illustrated in FIG. 1(a), since all nodes exist in the horizon region 7 for any one node 5, a comparatively accurate numerical analysis result may be obtained, but when the interactions of the nodes 5 which exist on the boundary 10 of the structure are calculated and summed as illustrated in FIG. 1(b), since all nodes do not exist in the horizon region 7 for any one node 5 located on the boundary 10 of the structure, an inaccurate numerical analysis result is obtained around the boundary 10 of the structure.

Accordingly, in a peridynamic method having an added mirroring node according to the present invention, a numerical analysis is performed by adding a mirroring node to an empty space in the horizon region 7 of any one node 5 located on the boundary 10 of the structure so as to improve the inaccurate numerical analysis result on the boundary 10 of the structure, which occurs in the existing peridynamic method.

Specifically, in the peridynamic method having an added mirroring node according to the present invention, the numerical analysis is performed by adding the mirroring node to the empty space in the horizon region 7 of the node X located on the boundary 10 of the structure illustrated in FIG. 1(b).

Hereinafter, the peridynamic method having an added mirroring node according to the present invention will be described in detail.

FIG. 2 is a diagram for describing a method for obtaining a shape tensor in Equation 3 and FIG. 3 is a diagram for describing an added mirroring node when a node is located at a boundary to which a Dirichlet boundary condition is applied.

A Dirichlet boundary refers to a boundary to which force is applied on the boundary 10 of the structure. A Dirichlet boundary condition refers to a case where a boundary condition is previously given, i.e., a case where positions of nodes which exist on the boundary of the structure are fixed to a specific position. A boundary 50 to which the Dirichlet boundary condition is applied refers to a boundary to which the Dirichlet boundary condition is applied on the boundary 10 of the structure. In addition, the mirroring node refers to a node added to the outside of the boundary 50 to which the Dirichlet boundary condition is applied based on the boundary 50 to which the Dirichlet boundary condition is applied.

Referring to FIGS. 2 and 3, a structure (or material) to which the peridynamic method is applied has the nodes and the nodes include a first node 20 and a second node 30.

A motion equation of the peridynamic method, which is applied to the peridynamic method having an added mirroring node according to the embodiment of the present invention is shown in Equation 1 below.

$$\rho \ddot{u}(x,t) = \int_{Hx} \{\underline{T}[x,t]<x'-x> - \underline{T}[x'-x]<x-x'>\}dV_{x'} + b(x,t) \quad \text{[Equation 1]}$$

Equation 1 is a general equation representing the motion equation of the peridynamic method, and when the motion equation of the peridynamic method of the first node is obtained by using Equation 1, $\rho$ represents a density, $\ddot{u}(x,t)$ represents an acceleration of a first node $20(x)$, $b(x,t)$ represents a body force of the first node 20, $\underline{T}[x,t]$ represents a force state vector of the first node 20, and $\underline{T}[x',t]$ represents a force state vector of a second node $30(x')$.

The second node $30(x')$ is a node in a horizon region 40 of the first node 20. There may be a plurality of second nodes 30.

An equation of obtaining the force state vector in Equation 1 is shown in Equation 2 below.

$$\underline{T} = \underline{\omega}<\underline{\xi}>PK^{-1} \quad \text{[Equation 2]}$$

Here, $\underline{\omega}$ represents an influence function and may be assumed as 1, $\underline{\xi}$ represents a vector between the first node 20 and the plurality of second nodes 30, P represents a first Piola-Kirchhoff stress tensor, and K represents a shape tensor.

The force state vector is obtained for each of the first node 20 and the plurality of second nodes 30 and substituted into Equation 1.

An equation of obtaining the shape tensor in Equation 2 is shown in Equation 3 below.

$$K = \underline{X}*\underline{X} = \int_H \underline{\omega}<\underline{\xi}>\underline{X}<\underline{\xi}>\lfloor\underline{X}<\underline{\xi}>dV = \int_H \underline{\xi}\lfloor\underline{\xi}dV \quad \text{[Equation 3]}$$

Here, $\underline{\omega}$ represents the influence function and may be assumed as 1, $\underline{\xi}$ represents the vector between the first node 20 and the plurality of second nodes 30, and V represents a volume of the second node 30.

A case of calculating the peridynamic motion equation of the first node 20 by using Equations 1 to 3 described above will be described separately in first and second embodiments of the present invention.

First Embodiment of Present Invention

When the first node 20 is the node located on the boundary 10 of the structure and the peridynamic motion equation of the first node 20 is calculated, the shape tensor is first calculated by using Equation 3 (step 1) and the force state vector is calculated for the first node 20 and each of the plurality of second nodes 30 by substituting the calculated shape tensor into Equation 2 (step 2). In addition, the calculated force state vector is substituted into Equation 1 to calculate the peridynamic motion equation of the first node 20 (step 3).

According to the first embodiment of the present invention, a case where the first node 20 is the node located on the boundary 10 of the structure and the peridynamic motion equation of the first node 20 is calculated will be described below in detail with reference to FIG. 2.

The peridynamic motion equation of the first node 20 may be obtained by calculating Equation 1. In order to calculate Equation 1, the shape tensor and the force state vector should be obtained by calculating Equations 2 and 3.

Referring to FIG. 2, the first node 20 is the node located on the boundary 10 of the structure and has a predetermined size horizon region 40. A plurality of second nodes 30-1, 30-2, and 30-3 exists in the horizon region 40 for the first node 20.

The plurality of second nodes 30-1, 30-2, and 30-3 is nodes in the horizon region 40 for the first node 20. The plurality of second nodes 30-1, 30-2, and 30-3 includes one or more third nodes 30-3.

The third node 30-3 refers to a second node 30 having no node at a point origin-symmetrical based on the first node 20 among the plurality of second nodes 30-1, 30-2, and 30-3. There may be one or more third nodes 30-3 according to a size of the horizon region 40. In FIG. 2, there is one third node 30-3 in the horizon region 40.

The shape tensor of Equation 3 may be shown in Equation 4 below.

$$K_k = \Sigma_{j=1}^n \underline{\omega}<x_j-x_k>(x_j-x_k)\lfloor(x_j-x_k)\Delta V_j \quad \text{[Equation 4]}$$

Here, $x_k$ and $x_j$ are the nodes and $K_k$ is the shape tensor of the node $x_k$.

When Equation 4 is described with reference to FIG. 2 which is the first embodiment of the present invention, $K_k$ is the shape tensor of the first node 20, the node $x_k$ is the first node 20, and the node $x_j$ is the plurality of second nodes 30-1, 30-2, and 30-3.

According to the first embodiment, when the shape tensor of the first node 20 is calculated (step 1), the shape tensor of the first node 20 may be calculated by using a position value (coordinate) in which the third node 30-3 is origin-symmetrical based on the first node 20. Specifically, referring back to FIG. 2, the third node 30-3 is mirrored (is origin-symmetrical) based on the first node 20 and a position value of a portion 30-4 located in an empty space 40-1 in the horizon region 40 is substituted into Equation 4 to calculate the shape tensor of the first node 20. Here, it is noted that the mirroring node is not added to the portion 30-4 located in the empty space in the horizon region 40 and the mirroring node is not added and it is assumed that there is the mirroring node and the position value thereof is substituted into Equation 4.

Accordingly, the plurality of second nodes 30-1, 30-2, and 30-3 and the third node 30-3 are mirrored (is origin-symmetrical) based on the first node 20 and the position value of the portion 30-4 located in the empty space 40-1 in the horizon region 40 is substituted into Equation 4, and as a result, n=4 in Equation 4 and the shape tensor $K_k$ of the first node 20 is calculated from j=1 to j=4.

At the time of calculating Equation 4, when the third node 30-3 is mirrored (is origin-symmetrical) based on the first node 20 and the position value of the portion 30-4 located in the empty space 40-1 in the horizon region 40 is not substituted and only the plurality of second nodes 30-1, 30-2, and 30-3 is substituted and the shape tensor of the first node 20 is calculated, a result shown in Equation 5 below may be obtained.

$$K_k = \sum_{j=1}^{n} \omega \langle x_j - x_k \rangle \quad \text{[Equation 5]}$$

$$(x_j - x_k) \otimes (x_j - x_k) \Delta V_j = \begin{bmatrix} \Delta x \times \Delta x & 0 \\ 0 & 2(\Delta x \times \Delta x) \end{bmatrix} (\Delta x)^3$$

Here, $K_k$ is the shape tensor of the first node 20, the node $x_k$ is the first node 20, and the node $x_j$ is the plurality of second nodes 30-1, 30-2, and 30-3. $\Delta x$ represents a distance between the node $x_k$ and the node $x_j$. Since n=3 in Equation 5, the shape tensor $K_k$ of the first node 20 is calculated from j=1 to j=3.

For comparison with Equation 5, by referring back to FIG. 2, when the shape tensor of the third node 30-3 having a complete horizon region 41 in which there is no empty space in the horizon region 41 is calculated, the result shown in Equation 6 below may be obtained.

$$K_j = \begin{bmatrix} 2(\Delta x \times \Delta x) & 0 \\ 0 & 2(\Delta x \times \Delta x) \end{bmatrix} (\Delta x)^3 \quad \text{[Equation 6]}$$

Here, $K_j$ represents the shape tensor of the third node 30-3 and $\Delta x$ represents a distance between the third node 30-3 and another neighboring node neighboring to the third node 30-3.

When Equations 5 and 6 are compared with each other, the first node 20 having an incomplete horizon region 40 in which there is the empty space 40-1 in the horizon region 40 has a shape tensor different from the shape tensor of the third node 30-3 having the complete horizon region 41 in which there is no empty space in the horizon region 41.

In order to solve this, at the time of calculating Equation 4, when the plurality of second nodes 30-1, 30-2, and 30-3, and the third node 30-3 are mirrored (is origin-symmetrical) based on the first node 20 and the position value of the portion 30-4 located in the empty space 40-1 in the horizon region 40 is substituted and the shape tensor of the first node 20 is calculated, the result shown in Equation 7 below may be obtained.

$$K_k = \begin{bmatrix} 2(\Delta x \times \Delta x) & 0 \\ 0 & 2(\Delta x \times \Delta x) \end{bmatrix} (\Delta x)^3 \quad \text{[Equation 7]}$$

In Equation 7, since n=4 in Equation 4, the shape tensor $K_k$ of the first node 20 is calculated from j=1 to j=4.

When Equations 6 and 7 are compared with each other, it can be seen that the shape tensor of the first node 20 is the same as the shape tensor of the third nod 30-3 having the complete horizon region 41 in which there is no empty space in the horizon region 41.

According to the first embodiment of the present invention, when the first node 20 is the node located on the boundary 10 of the structure and the peridynamic motion equation of the first node 20 is calculated, a position value (coordinate) in which the third node 30-3 is origin-symmetrical based on the first node 20 is used at the time of calculating the shape tensor of the first node 20 (step 1) as described above. In addition, the calculated shape tensor is substituted into Equation 2 to calculate the force state vector for the first node 20 and each of the plurality of second nodes 30-1, 30-2, and 30-3 (step 2). In addition, the calculated force state vector is substituted into Equation 1 to calculate the peridynamic motion equation of the first node 20 (step 3).

Second Embodiment of Present Invention

When the first node 20 is the node located on the boundary 10 of the structure and the node located on a boundary 50 to which the Dirichlet boundary condition is applied, and the peridynamic motion equation of the first node 20 is calculated, the shape tensor is first calculated by using Equation 3 (step 1) and the force state vector is calculated for the first node 20 and each of the plurality of second nodes 20 by substituting the calculated shape tensor into Equation 2 (step 2). In addition, the calculated force state vector is substituted into Equation 1 to calculate the peridynamic motion equation of the first node 20 (step 3).

According to the second embodiment of the present invention, if the first node 20 is the node located on the boundary 10 of the structure and the node located on the boundary 50 to which the Dirichlet boundary condition is applied, when the peridynamic motion equation of the first node 20 is calculated, since steps 1 and 2 in the second embodiment of the present invention are the same as steps 1 and 2 in the first embodiment of the present invention, a description of steps 1 and 2 in the second embodiment of the present invention is omitted and replaced with contents described in steps 1 and 2 in the first embodiment of the present invention. Therefore, hereinafter, step 3 will be described.

When the peridynamic motion equation of the first node 20 is calculated by using Equation 1 (step 3), the mirroring node is added by mirroring one or more third nodes 30-3 based on the first node 20 and then the peridynamic motion equation of the first node 20 is calculated.

Referring to FIGS. 2 and 3, the first node 20 is the node located on the boundary 10 of the structure and the node located on the boundary 50 to which the Dirichlet boundary condition is applied and has a predetermined size horizon region 40. In FIG. 2, the predetermined size horizon region 40 is illustrated, but in FIG. 3, the horizon region is not illustrated.

The plurality of second nodes 30-1, 30-2, and 30-3 are nodes in the horizon region 40 for the first node 20. The plurality of second nodes 30-1, 30-2, and 30-3 include one or more third nodes 30-3.

The third node 30-3 refers to a second node 30 having no node at a point origin-symmetrical based on the first node 20 among the plurality of second nodes 30-1, 30-2, and 30-3. There may be one or more third nodes 30-3 according to the size of the horizon region.

In third step in which the peridynamic motion equation of the first node 20 is calculated by using Equation 1, the mirroring node is added by mirroring the plurality of third nodes 30-3 based on the first node 20 and then the peridynamic motion equation of the first node 20 is calculated.

Referring back to FIG. 3, when a case where a mirroring node 30-3' is added by mirroring the third node 30-3 based on the first node 20 is specifically described, the added mirroring node 30-3' (a node located at a node $x'_1$) is a node 30-3' located outside the boundary 50 to which the Dirichlet boundary condition which exists at a position origin-symmetrical is applied if the third node 30-3 (a node located at a node $x_2$) is origin-symmetrical based on the first node 20 (a node located at a node $x_1$ located on the boundary 50 to which the Dirichlet boundary condition is applied).

The mirroring node is added only to nodes located on the boundary 50 (primary boundary condition) to which the Dirichlet boundary condition is applied rather than all nodes located on the boundary 10 of the structure.

When a size $\delta$ in one direction of the horizon region is $n\Delta x$, the number of added mirroring nodes may be $(n-1)$. Here, n is a constant and when n-1 is a real number, numbers below a decimal point are discarded. $\Delta x$ represents a distance between the node located on the boundary 50 to which the Dirichlet boundary condition is applied and another node neighboring to the node. FIG. 3 is an embodiment illustrating a case where (n-1) mirroring nodes are added based on each of the boundary 50 to which the Dirichlet boundary condition is applied. In FIG. 3, m represents the number of nodes which exist between the boundaries 40 to which the Dirichlet boundary condition is applied. Even if more than (n-1) mirroring nodes are added, there is no correlation with the numerical analysis result, but (n-1) mirroring nodes are appropriate for computational efficiency. However, the number of added mirroring nodes is not determined as (n-1), but may be determined differently according to the second embodiment of the present invention.

In step 1 of calculating the shape tensor, since only an existing reference configuration is used, the boundary condition is not required, but in step 3 of calculating the peridynamic motion equation of the first node 20, the boundary condition for the added mirroring nodes is required when calculating an integral equation of Equation 1.

The boundary condition of the added mirroring node is as follows.

A displacement value of the added node (mirroring node) has an origin symmetry value of a displacement value of a node inside the boundary 50 to which the Dirichlet boundary condition is applied based on the node which exists on the boundary 50 to which the Dirichlet boundary condition is applied. In other words, a displacement value between the node located on the boundary 50 to which the Dirichlet boundary condition is applied and the node located inside the boundary 50 to which the Dirichlet boundary condition is applied is equal to a displacement value between the added mirroring node and the node located on the boundary 50 to which the Dirichlet boundary condition is applied. Referring to FIG. 3, a displacement value between the added mirroring node 30-3' and the first node 20 is equal to an origin symmetric value of a displacement value between the first node 20 and the third node 30-3.

Further, according to the second embodiment of the present invention, the boundary condition of the added mirroring node may be as follows.

The displacement value of the added node (mirroring node) may adopt a displacement value of the node which exists outside the horizon region of the node which exists on the boundary 50 to which the Dirichlet boundary condition is applied based on the node which exists on the boundary 50 to which the Dirichlet boundary condition is applied.

In other words, a displacement value between the added node (mirroring node) and the node located on the boundary 50 to which the Dirichlet boundary condition is applied adopts a value which is origin symmetrical to a displacement value between the node located on the boundary 50 to which the Dirichlet boundary condition is applied and the fourth node and adopts a value which is origin symmetrical to the displacement value in proportion to the distance between the node located on the boundary 50 to which the Dirichlet boundary condition is applied in the existing reference configuration and the added node (mirroring node) and the distance between the node located on the boundary 50 to which the Dirichlet boundary condition is applied and the fourth node. Here, the fourth node refers to a node which exists outside the horizon region of the node located on the boundary 50 to which the Dirichlet boundary condition is applied.

Specifically, the displacement value between the added node (mirroring node) and the first node 20 adopts a value which is origin symmetrical to the displacement value between the first node 20 and the fourth node and adopts a value which is origin symmetrical to the displacement value in proportion to the distance between the added node (mirroring node) and the first node 20 and the distance between the first node 20 and the fourth node. Here, the fourth node refers to a node which exists outside the horizon region of the first node 20.

According to the second embodiment of the present invention, when the first node 20 is the node located on the boundary 10 of the structure and the node located on the boundary 50 to which the Dirichlet boundary condition is applied, and the peridynamic motion equation of the first node 20 is calculated, a position value (coordinate) in which the third node 30-3 is origin symmetrical based on the first node 20 is used at the time of calculating the shape tensor of the first node 20 (step 1) as described above. In addition, the calculated shape tensor is substituted into Equation 2 to calculate the force state vector for the first node 20 and each of the plurality of second nodes 30-1, 30-2, and 30-3 (step 2). In addition, when the calculated force state vector is substituted into Equation 1 and the peridynamic motion equation of the first node 20 is calculated (step 3), the mirroring node is added to the nodes located on the boundary 50 to which the Dirichlet boundary condition is applied and the boundary condition is reflected as described above.

<Numerical Analysis Result>

The numerical analysis is performed by applying the peridynamic method having the added mirroring node according to embodiments of the present invention to the structure and this is compared with the numerical result by applying the existing peridynamic method to the structure. In order to compare results of both methods, a numerical analysis mode illustrated in FIG. 4 is created.

FIG. 4 is a diagram illustrating a numerical analysis model for applying embodiments of the present invention.

Referring to FIG. 4, each of a width, a length and a height of the numerical analysis model is 4 m, a density is 1230 kg/m$^2$, a Young's modulus is 0.53Δ10$^{10}$ Pa, a Poisson ratio is 0.35, a time interval is 1.0Δ10$^{-6}$, and the size of the horizon region is 2Δx, and Δx is 0.25 m. As the boundary condition, a strain of 0.001 is applied to nodes located at both ends of an x axis. Further, since the size of the horizon region is 2Δx, nodes of one layer are added to both ends of the x axis, respectively.

FIG. 5 is a diagram illustrating an x-axis direction displacement along an x axis of a numerical analysis model and an error thereof. FIG. 5(*a*) illustrates a displacement in an x-axis direction along the x axis of the numerical analysis model and FIG. 5(*b*) is a diagram illustrating an x-axis direction displacement error along the x axis of the numerical analysis model.

Referring to FIG. 5, FIG. 5 shows an x-axis direction numerical analysis result along the x axis of the numerical analysis model through a graph when y=0 and z=0. Nonordinary state-based peridynamics (Original NOSB PD) represents the existing peridynamic method and Modified NOSB PD represents the peridynamic method having the added mirroring node according to the embodiment of the present invention.

A theoretical solution, and the results of the existing peridynamic method and the peridynamic method having the added mirroring node are compared with each other. In FIG. 5(*b*), it can be seen that the existing peridynamic method has a large error between the result of the existing peridynamic method and the theoretical solution around the boundary of the structure. On the contrary, it can be seen that in the peridynamic method having the added mirroring node according to the embodiment of the present invention, a very small error occurs in overall.

FIG. 6 is a diagram illustrating a z-axis direction displacement along a z axis of a numerical analysis model and an error thereof. FIG. 6(*a*) illustrates a z-axis direction displacement along a z axis of the numerical analysis mode and FIG. 6(*b*) is a diagram illustrating a z-axis direction displacement error along the z axis of the numerical analysis model.

FIG. 6 shows a z-axis direction displacement value along the z axis of the numerical analysis model when x=0 and y=0 through the graph. Similarly as described above, it can be seen that when the strain of 0.001 is applied in the x-axis direction, the z-axis displacement occurs according to the Poisson ratio. In FIG. 6(*b*), similarly to the case of the x axis, it can be seen that in the result of the existing peridynamic method, the z-axis displacement is also inaccurate on the boundary of the structure. Further, it can be seen that when the peridynamic method having the added mirroring ode according to the embodiment of the present invention is used, the numerical analysis result is not significantly different from the theoretical solution. Accordingly, when the peridynamic method having the added mirroring node according to the embodiment of the present invention is applied, an error which occurs around the boundary of the structure may be reduced.

In general, the peridynamic method is a technique used as a numerical analysis method for a cracking phenomenon of the structure. When the peridynamic method having the added mirroring node according to the embodiment of the present invention is applied to the numerical analysis for the cracking phenomenon or the boundary region of the structure, a more accurate numerical result may be obtained than that in the existing peridynamic methods in the crack or boundary region of the structure. Through the present invention, accuracy of the numerical analysis result for the cracking phenomenon of the structure or the boundary region of the structure may be increased and the number of nodes required for obtaining the accurate numerical analysis result may be reduced. In addition, effects of reduction of a numerical analysis time and increment of numerical analysis efficiency may be obtained due to the reduction of the number of nodes required for the numerical analysis.

The peridynamic method having the added mirroring node according to the embodiments of the present invention, which is described in FIGS. 1 to 6 may be implemented in the form of a program command which may be executed through various computer components and recorded in a computer readable recording medium. The computer readable recording medium may include the program command, a data file, or a data structure singly or a combination thereof.

The program command recorded in the computer readable recording medium may be specially designed and configured for the present invention, or may be publicly known to and used by those skilled in the computer software field.

Examples of the computer readable recording media may include a hardware device particularly configured to store and execute program commands, magnetic media such as hard disks, floppy disks, and magnetic tape, optical recording media such as CD-ROM disks and DVD, magneto-optical media such as floptical disks, ROM, RAM, and flash memories. Examples of the program command also include a high-level language code executable by a computer by using an interpreter, and the like, as well as a machine language code created by a compiler. The hardware device may be configured to be operated with one or more software modules in order to execute processing according to the present invention and vice versa.

Further, a numerical analysis apparatus 100 may be implemented by using the peridynamic method having the added mirroring node according to the embodiment of the present invention.

FIG. 7 is a diagram illustrating a numerical analysis apparatus using a peridynamic method according to an embodiment of the present invention.

Referring to FIG. 7, the numerical analysis apparatus 100 may include a first calculation unit 110, a second calculation unit 120, and a third calculation unit 130. The first calculation unit 110 calculates a shape tensor K of the first node 20 and the second calculation unit 120 calculates force state vectors $\underline{T}$ of the first node 20 and each of the plurality of second nodes 30 by using the shape tensor. The third calculation unit 130 calculates the peridynamic motion equation of the first node 20 by using the force state vector. Here, the first node 20 is the node located on the boundary 10 of the structure and has a predetermined size horizon region 40. The plurality of second nodes 30 are nodes in the horizon region 40 and include one or more third nodes 30-3. The third node 30-3 refers to a second node having no node at a point origin-symmetrical based on the first node 20 among the plurality of second nodes 30.

The first calculation unit 110 calculates the shape tensor by using a position value in which the third node 30-3 is origin symmetrical to the first node 20.

When the first node 20 is a node located on a boundary 50 to which the Dirichlet boundary condition is applied, the third calculation unit 130 mirrors the plurality of third nodes based on the first node 20 and adds the mirroring node and then calculates the peridynamic motion equation of the first node 20.

Features, structures, effects, and the like described in the above embodiments are included in at least one embodiment of the present invention, and are not particularly limited to only one embodiment. Furthermore, features, structures, effects, and the like exemplified in each embodiment may be combined or modified for other embodiments those skilled in the art to which the embodiments pertain. Therefore, the contents related to such combinations and modifications should be interpreted as being included in the scope of the present invention.

In addition, although the embodiments have been mainly described above, these are merely examples and do not limit the present invention, and those skilled in the art to which the present invention pertains will know that various modifications and applications not illustrated above can be made within the scope without departing from the essential characteristics of the embodiment. That is, each component specifically shown in the embodiment can be implemented by being modified. In addition, it will be interpreted that differences related to the modifications and applications are included in the scope of the present invention defined in the appended claims.

EXPLANATION OF REFERENCE NUMERALS AND SYMBOLS

10: Boundary of structure (or material)
20: First node
30, 30-1, 30-2: Second node
30-3: Third node
40: Horizon region
50: Boundary to which Dirichlet boundary condition is applied
100: Numerical analysis apparatus
110: First calculation unit
120: Second calculation unit
130: Third calculation unit

The invention claimed is:

1. A peridynamic method for reducing errors in calculating displacement values of nodes of a structure, the peridynamic method comprising:
a first step of calculating a shape tensor K of a first node;
a second step of calculating force state vectors $\underline{T}$ of the first node and each of a plurality of second nodes by using the shape tensor; and
a third step of calculating a peridynamic motion equation of the first node by using the force state vectors,
wherein the first node is a node located on a boundary of the structure and has a predetermined size horizon region,
the plurality of second nodes are nodes in the horizon region,
the plurality of second nodes includes one or more third nodes,
the third node is a second node having no node at a point which is origin-symmetrical based on the first node among the plurality of second nodes, and
in the first step, the shape tensor is calculated by using a position value in which the third node is origin-symmetrical based on the first node,
wherein the structure is a material, and the boundary is a crack or a boundary region in the material.

2. The peridynamic method of claim 1, wherein a Dirichlet boundary condition is applied to the boundary of the structure, and
in the third step, a mirroring node is added by mirroring the plurality of third nodes based on the first node and then the peridynamic motion equation of the first node is calculated.

3. The peridynamic method of claim 2, wherein when a size $\delta$ in one direction of the horizon region is n$\Delta$x, the number of added mirroring nodes is n−1,
wherein n is a constant and when n−1 is a real number, numbers below a decimal point are discarded and $\Delta$x represents a distance between the first node and the third node.

4. The peridynamic method of claim 2, wherein in the process of calculating the peridynamic motion equation of the first node, the boundary condition of the added mirroring node is a displacement value between the added mirroring node and the first node, and
the displacement value between the added mirroring node and the first node is equal to a value in which a displacement value between the first node and the third node is origin-symmetrical.

5. The peridynamic method of claim 2, wherein in the process of calculating the peridynamic motion equation of the first node, the boundary condition of the added mirroring node is the displacement value between the added mirroring node and the first node,
the displacement value between the added mirroring node and the first node adopts a value which is origin symmetrical to a displacement value between the first node and a fourth node and is a displacement value changed in proportion to a distance between the added mirroring node and the first node and a distance between the first node and the fourth node, and
the fourth node is a node which exists outside the horizon region.

6. The peridynamic method of claim 1, wherein an equation of calculating the shape tensor is Equation 1 below:

$$\underline{K}=\underline{X}^*\underline{X}=\int_H \omega<\xi>\underline{X}<\xi>\lfloor\underline{X}<\xi>\rfloor dV=\int_H \xi\lfloor\xi dV \quad [\text{Equation 1}]$$

wherein $\underline{X}$ represents the first node, $\xi$ represents a vector between the first node and the plurality of second nodes, V represents a volume of the second node, and $\omega$ represents an influence function.

7. The peridynamic method of claim 1, wherein an equation of calculating the force state vector is Equation 2 below:

$$\underline{T}=\omega<\xi>PK^{-1}$$

wherein $\omega$ represents the influence function, $\xi$ represents a vector between the first node and the plurality of second nodes, P represents a first Piola-Kirchhoff stress tensor, and K represents the shape tensor.

8. The peridynamic method of claim 1, wherein an equation of calculating the peridynamic motion equation of the first node is Equation 3 below:

$$\rho\ddot{u}(x,t)=\int_{Hx}\{\underline{T}[x,t]<x'-x>-\underline{T}[x',t]<x-x'>\}dV_{x'}+b(x,t) \quad [\text{Equation 3}]$$

wherein ρ represents a density, ü(x,t) represents an acceleration of the first node, $\underline{T}[x,t]$ represents the force state vector of the first node, $\underline{T}[x',t]$ represents the force state vector of the second node, and b(x,t) represents a body force of the first node.

9. A computer readable recording medium having a program for executing a peridynamic method of claim 1, which is recorded therein.

10. A numerical analysis apparatus for reducing errors in calculating displacement values of nodes of a structure, the numerical analysis apparatus comprising one or more processors configured to:
    calculate a shape tensor K of a first node;
    calculate force state vectors $\underline{T}$ of the first node and each of a plurality of second nodes by using the shape tensor; and
    calculate a peridynamic motion equation of the first node by using the force state vectors, wherein the first node is a node located on a boundary of the structure and has a predetermined size horizon region,
the plurality of second nodes is nodes in the horizon region,
the plurality of second nodes includes one or more third nodes,
the third node is a second node having no node at a point which is origin-symmetrical based on the first node among the plurality of second nodes, and
the one or more processors are configured to calculate the shape tensor by using a position value in which the third node is origin-symmetrical based on the first node,
wherein the structure is a material, and the boundary is a crack or a boundary region in the material.

* * * * *